United States Patent
Zhang et al.

(10) Patent No.: US 6,483,375 B1
(45) Date of Patent: Nov. 19, 2002

(54) LOW POWER OPERATION MECHANISM AND METHOD

(75) Inventors: Kevin X. Zhang, Portland, OR (US); Micah Barany, Portland, OR (US); Krishnan Ravichandran, Saratoga, CA (US); Bob Jackson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/892,632

(22) Filed: Jun. 28, 2001

(51) Int. Cl.$^7$ ................................................ H03K 3/01
(52) U.S. Cl. ...................................................... 327/534
(58) Field of Search ................................. 327/530, 534, 327/535, 537, 564, 565, 566

(56) References Cited

U.S. PATENT DOCUMENTS

| 6,097,113 A | * | 8/2000 | Teraoka et al. | 307/125 |
|---|---|---|---|---|
| 6,177,831 B1 | * | 1/2001 | Yoneda et al. | 327/537 |
| 6,191,615 B1 | * | 2/2001 | Koga | 326/81 |
| 6,232,793 B1 | * | 5/2001 | Arimoto et al. | 326/34 |
| 6,304,110 B1 | * | 10/2001 | Hirano | 327/108 |
| 6,333,571 B1 | * | 12/2001 | Teraoka et al. | 307/115 |
| 6,380,798 B1 | * | 4/2002 | Mizuno et al. | 327/391 |

* cited by examiner

*Primary Examiner*—Jeffrey Zweizig
(74) *Attorney, Agent, or Firm*—Antonelli, Terry, Stout & Kraus, LLP

(57) ABSTRACT

An apparatus and method are provided for powering a chip having at least one transistor. A voltage regulating device may apply a first voltage and a second voltage to the transistor. The voltage regulating device may include a mechanism to apply a third voltage to a body contact of the transistor while applying the first voltage to the transistor. This places the transistor in a reverse body bias mode which conserves energy by reducing leakage current.

30 Claims, 6 Drawing Sheets

LOW POWER OPERATION MECHANISM AND METHOD

FIELD

The present invention is directed to power consumption. More particularly, the present invention is directed to reducing power consumption of a chip by applying reverse body bias to transistors of the chip.

BACKGROUND

Mobile processing units such as lap-top computers have special power concerns. This is because the battery that powers the mobile processing unit is a limited energy source. Therefore, the power consumption becomes of importance. It has become increasingly more difficult to achieve high performance and low power consumption per processing unit as the technology scaling trend continues. This is especially challenging for mobile systems where the power requirement is much more stringent. In order to stay within the given power envelope for a mobile system, the power supply (VCC) has to be scaled aggressively which leads to a much slower operating frequency. Because the device miniaturization leads to higher leakage and overall processing unit power, it has become more and more difficult to scale VCC alone to meet the power limits in mobile applications. The aggressive reduction of VCC also severely degrades the frequency and performance of the chip. It is therefore desirable to achieve better power/frequency scaling in mobile processing units.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
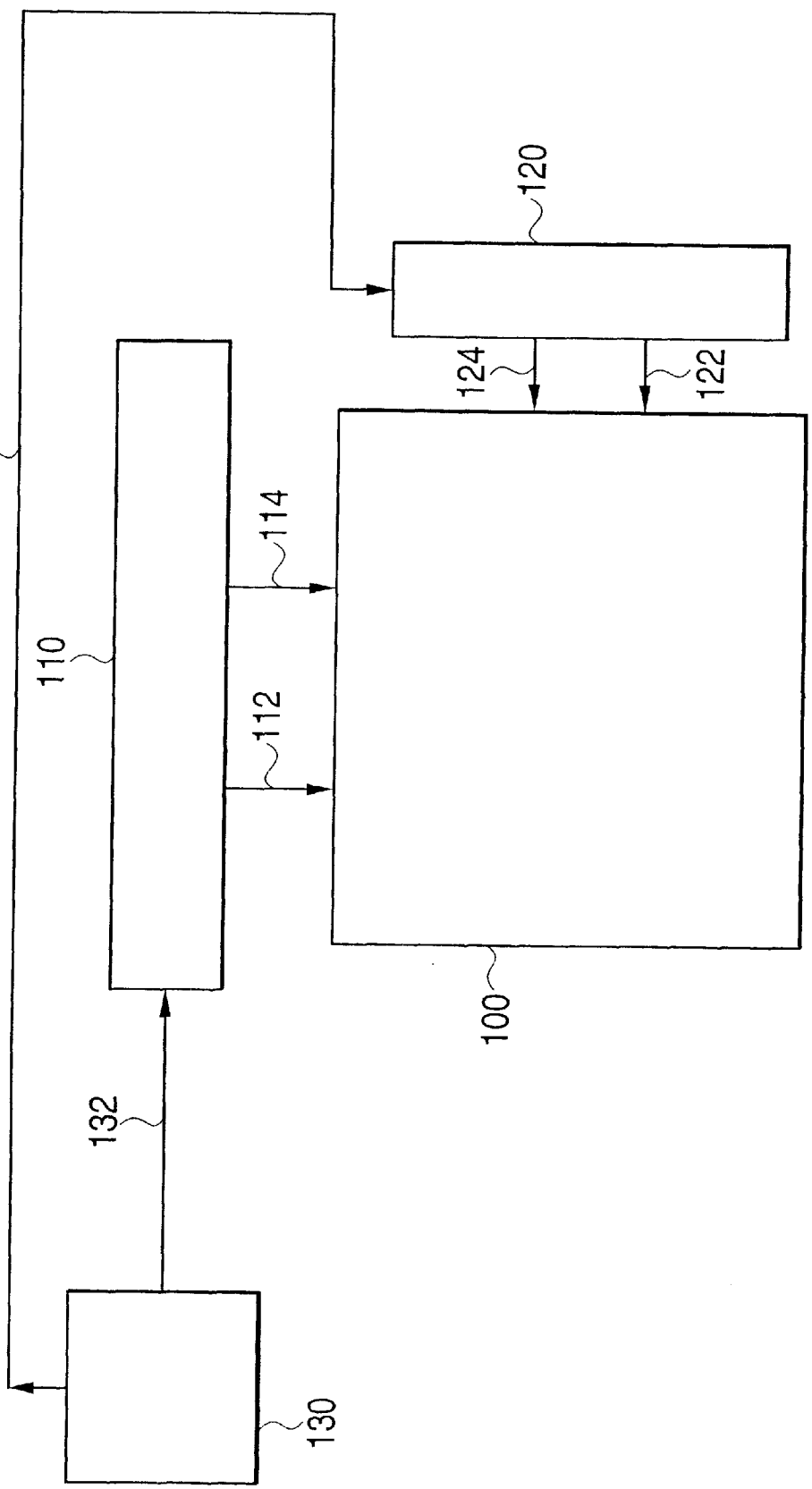
FIG. 1 illustrates a chip coupled to a voltage regulating device according to an example embodiment of the present invention.

In the following detailed description, like reference numerals and characters may be used to designate identical, corresponding or similar components in differing figure drawings. Further, in the detailed description to follow, example sizes/models/values/ranges may be given, although the present invention is not limited to the same. Well known power/ground connections to integrated circuits (ICs) and other components may not be shown within the Figures for simplicity of illustration and discussion, and so as not to obscure the invention. Embodiments may also be shown in block diagram form in order to avoid obscuring the invention, and also in view of the fact that specifics with respect to implementation of such block diagram arrangements may be highly dependent upon the platform within which the present invention is to be implemented. That is, such specifics should be well within the knowledge of one skilled in the art. Where specific details (e.g., circuits, voltage levels) are set forth in order to describe example embodiments of the invention, it should be apparent to one skilled in the art that the invention can be practiced without, or with variation of, these specific details. Finally, it should be apparent that differing combinations of hard-wired circuitry can be used to implement embodiments of the present invention. That is, the present invention is not limited to any specific combination of hardware and/or software.

Embodiments of the present invention may provide an apparatus for efficiently using the power supply to a chip. This may involve a voltage regulator device(s) that applies: a first a VCC+ voltage signal at approximately VCC; a second voltage (VSS) signal at approximately ground; which may be slightly less than VSS. The VCC+ and the VSS− voltages may be separately applied to a body contact of transistors within the chip so as to apply a reverse body bias to the respective transistors. The voltage levels of VCC+ and VSS− may be varied based on the desired mode of operation.

That is, embodiments of the present invention may apply a reverse body bias to lower the sub-threshold leakage in respective transistors of a chip. Since the overall leakage from transistors is a substantial source of the overall chip power, by applying the reverse body bias to the transistors, the overall chip power may be significantly reduced with a limited amount of speed degradation. Because the reverse body bias can be removed when the power limit is raised (such as in an AC mode operation), this mechanism does not impose speed penalties when it is required to provide maximum performance output.

Embodiments of the present invention will hereafter be described with respect to a chip that has at least one transistor and a voltage regulating device to apply a first voltage (such as VCC) and a second voltage (such as VSS) to the transistors. The voltage regulating device may further apply a third voltage (such as VCC+) to a body contact of the transistor while applying the first voltage to the transistor. This places the transistor in a reverse body bias mode, which leads to less leakage current and the conservation of energy.

Embodiments may also be described with respect to a method of powering a chip. This may involve applying a first voltage to at least one transistor, applying a second voltage to components of the chip and controlling a third voltage applied to a body contact of the transistor while the first voltage is applied to the transistor. This may cause the transistor to be placed in a reverse body bias mode.

FIG. 1 illustrates a chip 100 coupled to a voltage regulating device (including a voltage regulating device 110 and a voltage regulating device 120) according to an example embodiment of the present invention. Other embodiments and configurations are also within the scope of the present invention. The voltage regulating device 120 applies a VCC voltage signal along a signal line 124 to the chip 100 and applies a VSS voltage signal along a signal line 122 to the chip 100. The voltage regulating device 110 applies a VCC+ voltage signal along a signal line 112 to the chip 100 and applies a VSS− voltage signal along a signal line 114 to the chip 100. The voltage levels of the VSS− voltage signal and the VCC+ voltage signal may be varied as will be described below. Accordingly, FIG. 1 shows that power signals having different voltage levels may be applied to the chip 100. Although FIG. 1 shows the voltage regulating device 110 and the voltage regulating device 120 as two units, the functionality of these two voltage regulating devices may be provided within a single voltage regulating device or within more than two units. Further, although the voltage regulating devices 110 and 120 are shown external to the chip 100, the voltage regulating devices 110 and 120 may also be incorporated within the chip 100.

FIG. 1 further shows that an operating system device 130 may be coupled to the voltage regulating device 110 by a signal line 132 and the voltage regulating device 120 may be coupled to the operating system device 130 by a signal line 134. The operating system device 130 may control the output voltage levels of the signals (VCC+ and VSS−) on the signal lines 112 and 114 from the voltage regulating device 110. More specifically, the operating system device 130 may control the voltage level of VCC+ and VSS− on the signal lines 112 and 114, respectively. That is, when the chip 100 needs to be operated in a low-power mode (such as in a battery mode) then the signal lines 114 and 112 may supply a more negative bias (VSS−) than VSS and a higher bias (VCC+) than VCC. This will allow the chip to run more efficiently in terms of power and frequency scaling. However, when the chip 100 needs to provide maximum performance (such as in AC operation), then the operating system device 130 may control the voltage regulating device 110 such that the voltage signals on the signal lines 114 and 112 may supply an approximately zero bias (i.e., ground) and an approximately VCC supply, respectively. The voltage level of the signals on the signal lines 112 and 114 may be controlled by the operating system device 130 through the voltage regulating device 110 provided on the outside of the chip 100 based on power/performance requirements.

Accordingly, in addition to pins for VCC and VSS, embodiments of the present invention may utilize extra pins from the chip 100 to supply voltage levels of: (a) VSS or a few hundred millivolts below ground as the VSS− voltage level; and (b) VCC or a few hundred millivolts over VCC as the VCC+ voltage level. As one example, VCC may be 1.8 volts. Other values of VCC are also possible. The voltage level of VCC+ and VSS− may be used to apply a different body bias for both n substrates and p substrates during different operations.

Figure 2:
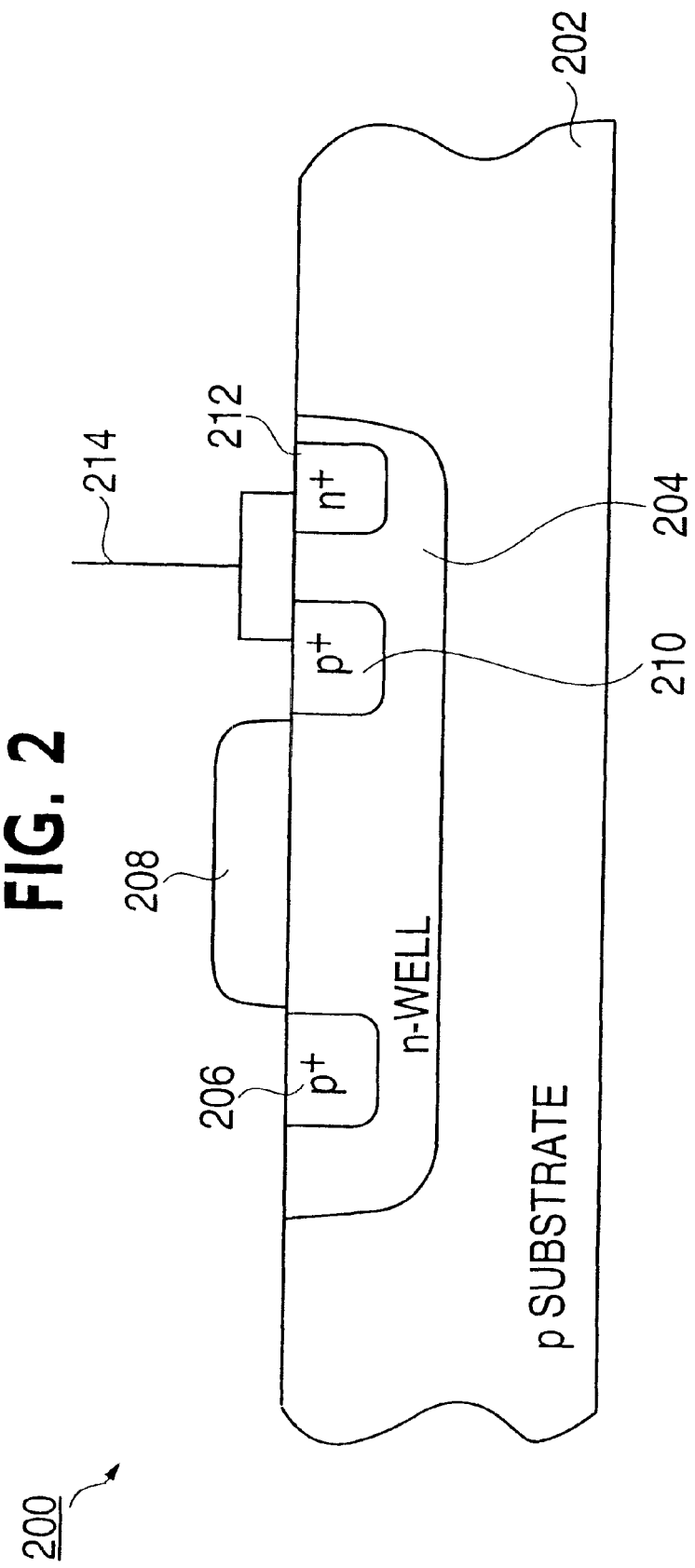
FIG. 2 illustrates a PMOS transistor.

FIG. 2 illustrates an example p-channel metal-oxide-semiconductor (PMOS) transistor. As shown, the PMOS transistor 200 includes a p substrate 202 having an n-well region 204 formed thereon. The n-well region 204 includes a drain contact 206 of p+ dopant and a source contact 210 of p+ dopant. A gate contact 208 may be formed above the n-well region 204. The n-well region 204 may further include a body contact 212 of n+ dopant that may be used to apply a body bias to the n-well region 204. A signal line 214 may be coupled to both the source contact 210 and the body contact 212. In this example, the PMOS transistor 200 is in a normal body bias mode since the source contact 210 and the body contact 212 are similarly biased based on the signal on the signal line 214.

Figure 3:
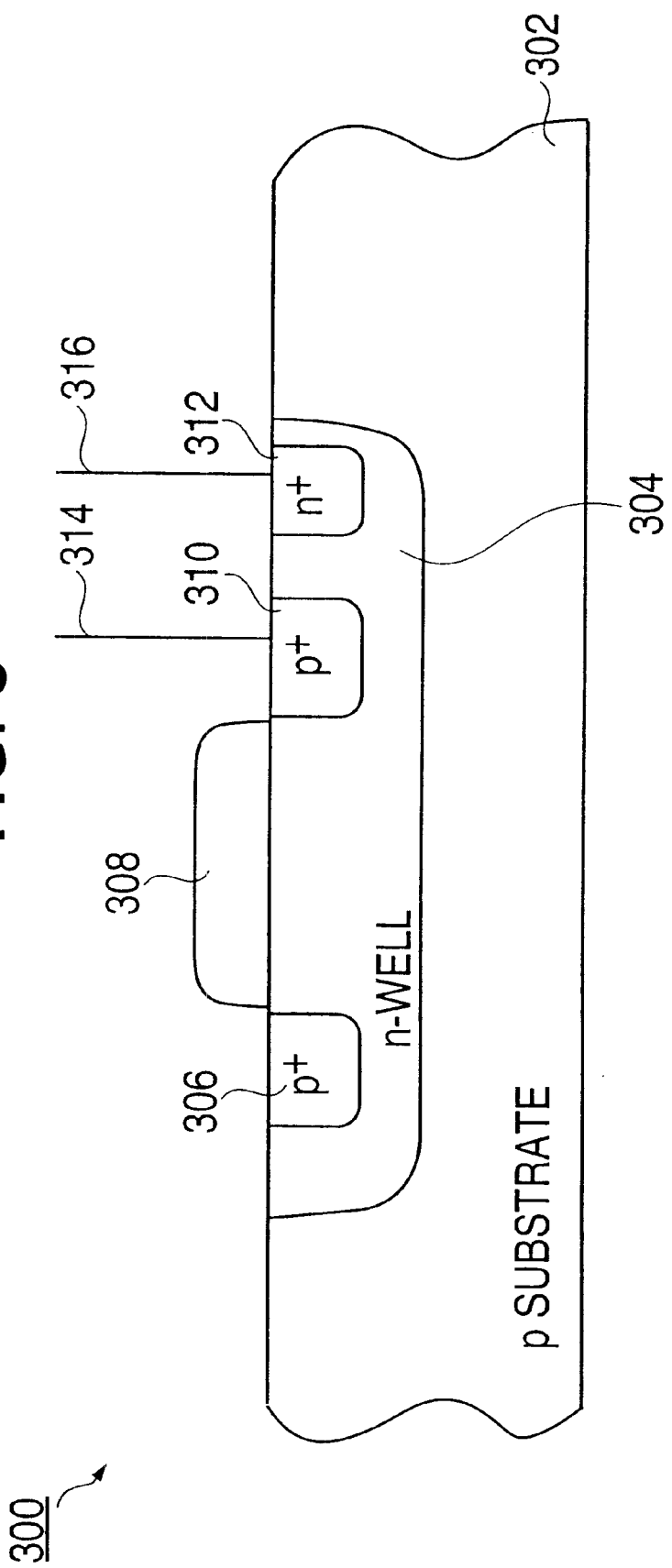
FIG. 3 illustrates a PMOS transistor coupled in accordance with an example embodiment of the present invention.

FIG. 3 shows a PMOS transistor coupled to signal lines according to an example embodiment of the present invention. Other configurations and embodiments are also within the scope of the present invention. The PMOS transistor 300 is similar to the PMOS transistor 200 with the exception that the source contact and the body contact are separately biased. This allows for reverse body bias of the transistor 300. More specifically, FIG. 3 shows a p substrate 302 having an n-well region 304 formed thereon. The n-well region 304 includes a drain contact 306 of p+ dopant, a source contact 310 of p+ dopant and a body contact 312 of n+ dopant. A gate contact 308 may also provided above the n-well region 304. The source contact 310 may be coupled to a signal line 314 and the body contact 312 may be separately coupled to a signal line 316 as shown in FIG. 3. The source contact 310 and the body contact 312 are no longer coupled together as in the FIG. 2 arrangement. This allows a first signal to be supplied to the signal line 314 and a second signal to be supplied to the signal line 316. Thus, the source contact 310 and the body contact 312 may be separately biased.

If the operating system device 130 is operating (or will operate) in the low power mode (i.e., a battery mode), then an indication signal(s) may be applied along the signal line 132 (FIG. 1) to the voltage regulating device 110. This signal may be indicative of how the voltage regulating device 110 should operate in the low power mode. The voltage regulating device 110 may output a higher VCC+ voltage signal on the signal line 112 (corresponding to the signal line 316 in FIG. 3). The voltage regulating device 120 may output a signal of voltage level VCC on the signal line 124 (corresponding to the signal line 314). In this low power mode, the source contact 310 may have a voltage of VCC and the body contact 312 may have a voltage of VCC+ (i.e., slightly higher than VCC). This is applying a reverse body bias to the transistor 300. When the operating system device 130 switches out of the low power mode (such as when in a normal AC mode), then an indication signal(s) may be applied along the signal line 132 to the voltage regulating device 110. The voltage of the signal output along the signal line 112 (corresponding to the signal line 316) may then be made closer or equal to the voltage of the VCC signal output along the signal line 124 (corresponding to the signal line 314). This takes the transistor 300 out of the reverse body bias mode and causes the transistor 300 to be in a normal body bias mode. One skilled in the art would understand that the chip 100 may include numerous PMOS transistors, each of which may be coupled in manner similar to that shown in FIG. 3.

Figure 4:
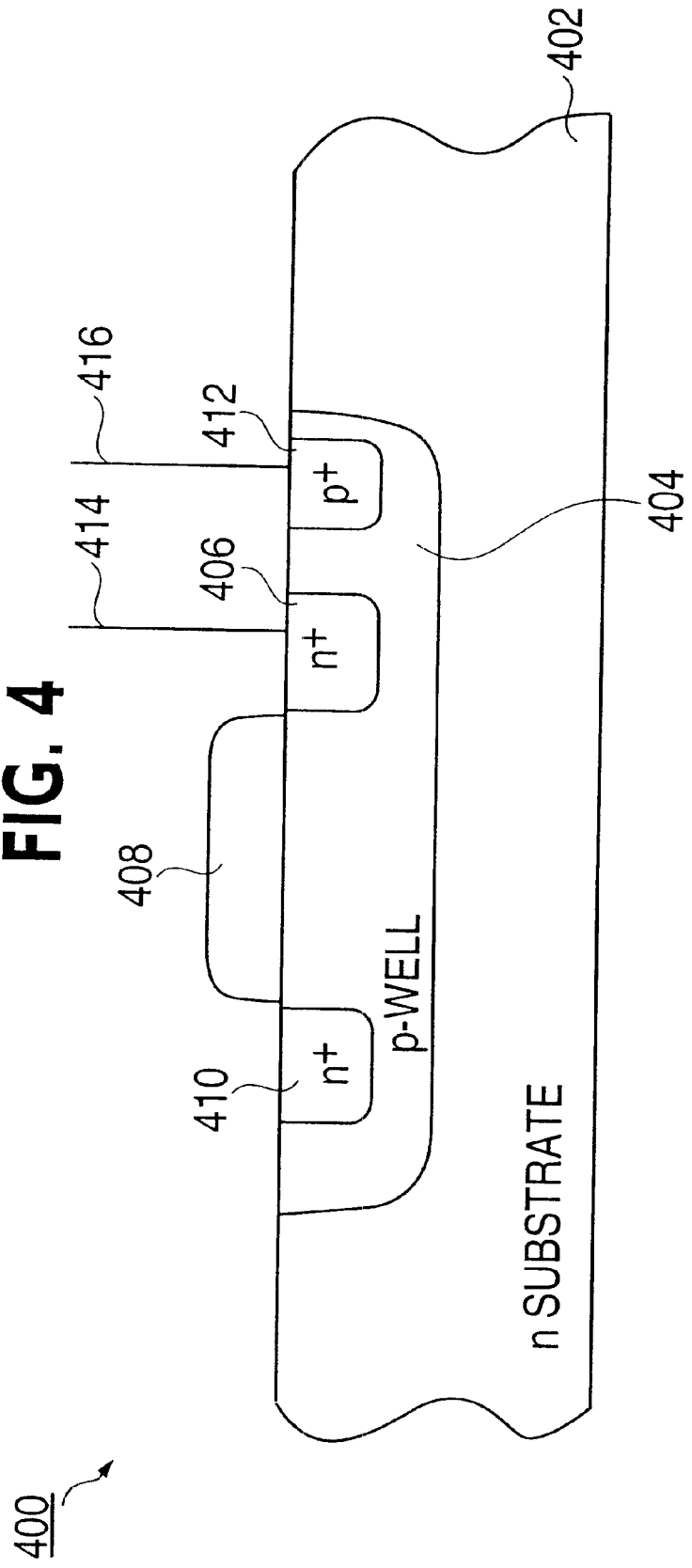
FIG. 4 illustrates an NMOS transistor coupled in accordance with an example embodiment of the present invention.

FIG. 4 shows an n-channel metal-oxide-semiconductor (NMOS) transistor 400 according to an example embodiment of the present invention. Other embodiments and configurations are also within the scope of the present invention. More specifically, FIG. 4 shows an n substrate 402 having a p-well region 404 formed thereon. The p-well region 404 includes a drain contact 410 of n+ dopant, a source contact 406 of n+ dopant and a body contact 412 of p+ dopant. A gate contact 408 may be formed above the p-well region 404. The source contact 406 may be coupled to a signal line 414 and the body contact 412 may be coupled to a signal line 416. Accordingly, separate signals may be applied to the source contact 406 and to the body contact 412. During operation, if the operating system device 130 determines that the chip 100 should or is operating in a low power mode, then an indication signal(s) may be applied along the signal line 132 (FIG. 1) to the voltage regulating device 110. This signal may be indicative of how the voltage regulating device 110 should operate in the low power mode. The voltage regulating device 110 may output a voltage signal of VSS− (i.e., slightly below VSS) along the signal line 114 (correspond to the signal line 416). The voltage regulating device 120 may output a signal of voltage level VSS on the signal line 122 (corresponding to the signal on signal line 414). This thereby causes the NMOS transistor 400 to be in a reverse body bias mode. When the operating system device 130 is moved out of the low power mode (such as when in a normal AC mode), then an indication signal(s) may be applied along the signal line 132 to the voltage regulating device 110. The voltage of the signal output along the signal line 114 (corresponding to the signal line 416) may be made closer or equal to the voltage of the signal on the signal line 122 (corresponding to the signal on the signal line 414). This takes the transistor 400 out of the reverse body bias mode and causes it to be in a normal body bias mode. One skilled in the art would understand that the chip 100 may include numerous NMOS transistors, each of which may be coupled in a manner similar to that shown in FIG. 4.

Figure 5:
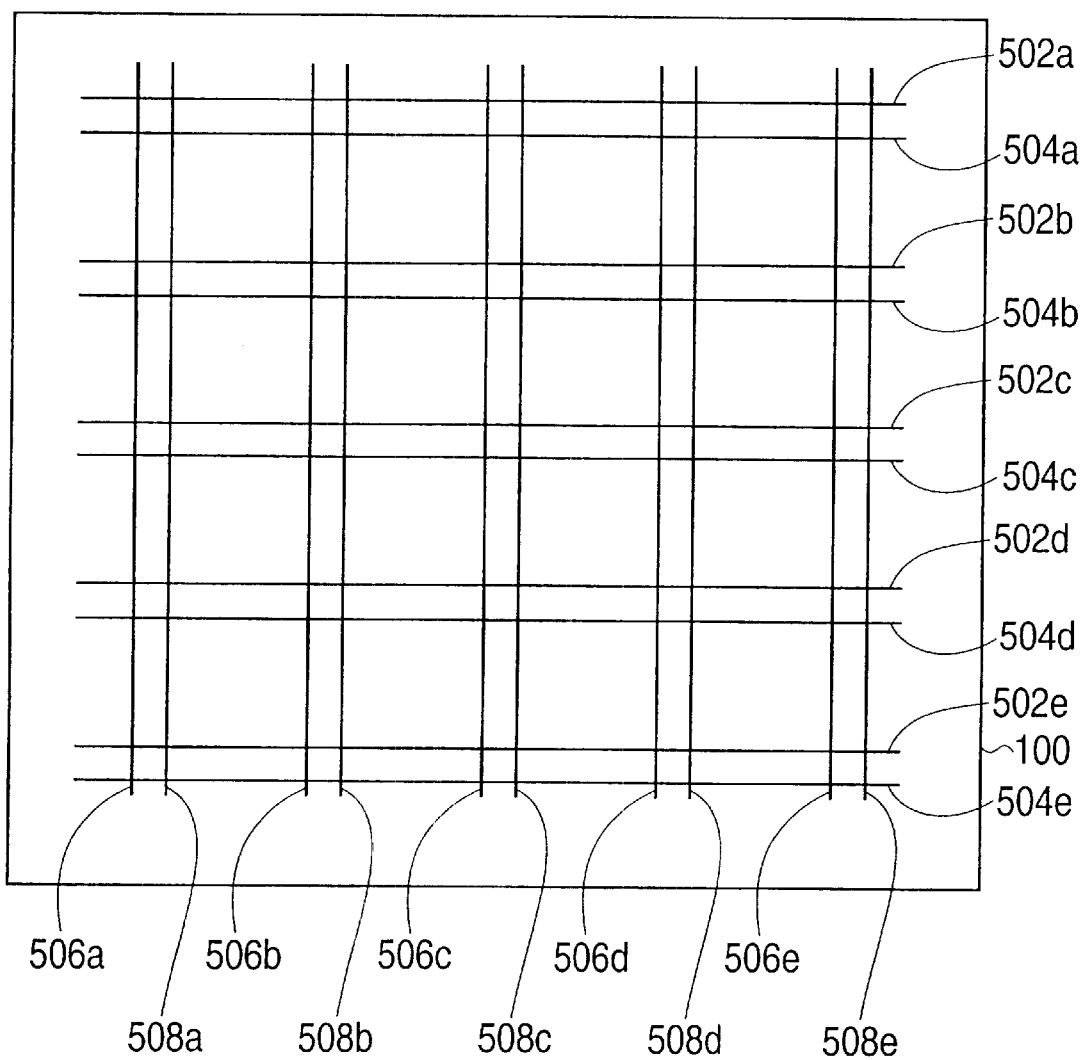
FIG. 5 illustrates a power grid of a chip in accordance with an example embodiment of the present invention.

FIG. 5 illustrates a power grid of the chip 100 in accordance with an example embodiment of the present invention. Other embodiments and configurations are also within the scope of the present invention. More specifically, FIG. 5 shows that the grid-like pattern may be formed by: (a) signal lines 502a, 502b, 502c, 502d and 502e; (b) signal lines 504a, 504b, 504c, 504d and 504e; (c) signal lines 506a, 506b, 506c, 506d and 506e; and (d) signal lines 508a, 508b, 508c, 508d and 508e. The signal lines 502a, 502b, 502c, 502d and 502e may each receive a signal of voltage level VCC (corresponding to the signal provided by the voltage regulating device 120 on the signal line 124). The signal lines 504a, 504b, 504c, 504d and 504e may each receive a signal of voltage level VSS (corresponding to the signal provided by the voltage regulating device 120 on the signal line 122). The signal lines 506a, 506b, 506c, 506d and 506e (substantially perpendicular to the signal lines 502a–e and 504a–e) may each receive a signal of voltage level VCC+ (corresponding to the signal provided by the voltage regulating device 110 on the signal line 112). The signal lines 508a, 508b, 508c, 508d and 508e (substantially perpendicular to the signal lines 502a–502e and 504a–504e) may each receive a signal of voltage level VSS− (corresponding to the signal provided by the voltage regulating device 110 on the signal line 114).

Figure 6:
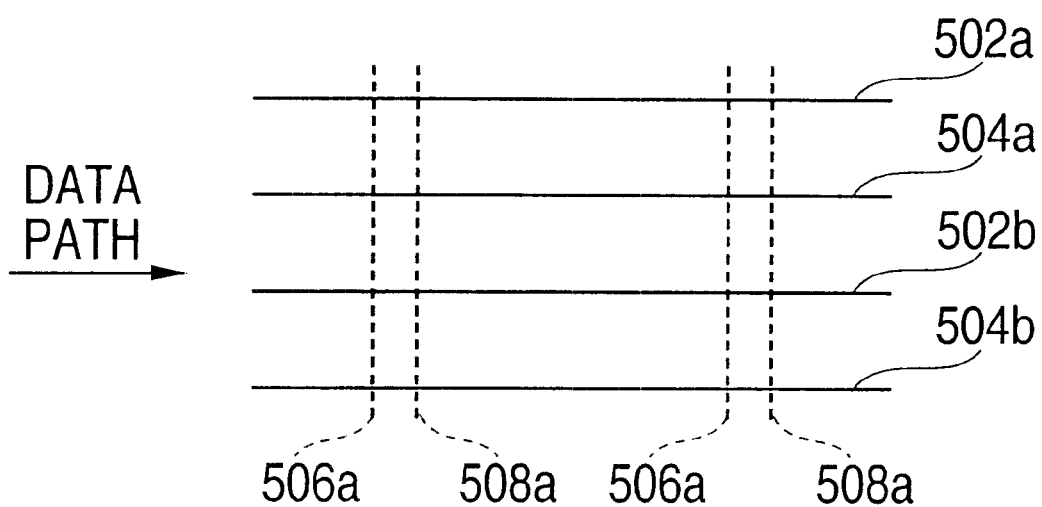
FIG. 6 illustrates signal lines of a chip in accordance with an example embodiment of the present invention.

FIG. 6 shows a further representation of how power may be distributed throughout the chip 100 in accordance with embodiments of the present invention.

The on-chip distribution of VSS− and VCC+ may be based on two power rails as shown in FIG. 5 and FIG. 6. Because the substrate current flow is very small (over several orders of magnitude lower than the switching current), the voltage supplies may be distributed through very loose grids. The cell-level implementation may be easily accomplished by having an additional substrate routing that is vertical to the normal VCC/VSS routes.

Embodiments of the present invention may provide a VCC voltage signal of approximately 1.8 volts and a VSS voltage signal of approximately zero volts (or ground). The VCC+ voltage level may be provided within a range of VCC to VCC+ 500 millivolts, for example, while the VSS− voltage level may be provided within a range of ground to ground minus 500 millivolts, for example. Other values of voltage levels for VCC, VCC+, VSS and VSS− are also within the scope of the present invention.

Accordingly, when a chip needs to operate in a low-power mode (such as battery mode), then two power pins may supply the negative bias (VSS−) and the higher VCC supply (VCC+) to the n-substrates and the p-substrates, respectively. This allows the chip to run more efficiently in terms of power and frequency scaling. When the chip needs to provide maximum performance, the two power pins may provide less negative or zero bias on the n-substrates and less positive over the VCC supply to the p-substrates. The exact voltage on these two pins may be controlled by the operating system through the voltage regulators provided outside the processing unit based on power/performance requirements.

A method has been described of powering a chip. This may involve applying power to the chip in a normal power mode (such as AC operations) and applying power to the chip (in a reverse body bias mode) when the chip is to operate in a lower power mode (such as battery operation).

In concluding, any reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the knowledge of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus comprising:
   a chip having at least one transistor and operable in a first power mode and a second power mode; and
   a voltage regulating device operable to power said chip in said first power mode by applying a first voltage to said at least one transistor and to apply a second voltage to a body contact of said at least one transistor, said voltage regulating device further operable to power said chip in said second power mode by applying a third voltage to said body contact of said at least one transistor while applying said first voltage to said at least one transistor.

2. The apparatus of claim 1, wherein said voltage regulating device is external to said chip.

3. The apparatus of claim 1, wherein said at least one transistor comprises a PMOS transistor having a source contact, a drain contact, a gate contact and said body contact, wherein in said first power mode said first voltage is applied to said source contact while said second voltage is applied to said body contact, said second voltage being higher than said first voltage so as to cause reverse body bias of said at least one transistor in said first power mode.

4. The apparatus of claim 1, wherein said at least one transistor comprises an NMOS transistor having a source contact, a drain contact, a gate contact and said body contact, wherein in said first power mode said first voltage is applied to said source contact while said second voltage is applied to said body contact, said second voltage being lower than said first voltage so as to cause reverse body bias of said at least one transistor in said first power mode.

5. The apparatus of claim 1, wherein said voltage regulating device further operable to power said chip in said first power mode by applying a fourth voltage to another transistor of said chip and to apply a fifth voltage to a body contact of said another transistor of said chip, and operable to power said chip in said second power mode by applying a sixth voltage to said body contact of said another transistor while applying said fourth voltage to said another transistor.

6. The apparatus of claim 5, wherein said chip further includes a first plurality of signal lines to apply said first voltage to transistors of said chip, a second plurality of signal lines to apply said fourth voltage to transistors of said chip, a third plurality of signal lines to apply said second voltage to transistors of said chip and to apply said third voltage to transistors of said chip, and a fourth plurality of signal lines to apply said fifth voltage to transistors of said chip and to apply said sixth voltage to transistors of said chip.

7. The apparatus of claim 6, wherein said third plurality of signal lines are substantially perpendicular to said fourth plurality of signal lines.

8. The apparatus of claim 1, wherein said second voltage causes a reverse body bias of said at least one transistor.

9. The apparatus of claim 1, further comprising an operating system device, coupled to said voltage regulating device, to control an operational power mode of said chip.

10. The apparatus of claim 1, wherein the third voltage comprises a ground voltage.

11. An apparatus comprising:
a plurality of transistors provided on a substrate;
a first plurality of signal lines provided on said substrate to distribute a first voltage to said plurality of transistors; and
a second plurality of signal lines provided on said substrate to distribute a second voltage to a body contact of at least one of said transistors while said first voltage is applied to said at least one transistor in a first power mode, and to distribute a third voltage to said body contact of said at least one of said transistors while said first voltage is applied to said at least one of said transistors in a second power mode.

12. The apparatus of claim 11, further comprising a third plurality of signal lines provided on said substrate to distribute a fourth voltage to other ones of said plurality of transistors, and a fourth plurality of signal lines provided on said substitute to distribute a fifth voltage to a body contact of said other ones of said transistors while said fourth voltage is applied to said other ones of said transistors in said first power mode and to distribute a sixth voltage to said body contact of said other ones of said transistors while said fourth voltage is applied to said other ones of said transistors in said second power mode.

13. The apparatus of claim 11, wherein said substrate, said plurality of transistors, said first plurality of signal lines, said second plurality of signal lines and said third plurality of signal lines are provided within a chip.

14. The apparatus of claim 13, further comprising a voltage regulating device to apply said first voltage to said first plurality of signal lines, and operable to power said chip in said first power mode by applying said second voltage to said second plurality of signal lines while applying said first voltage to said first plurality at signal lines and operable to power said chip in said second power mode by applying said third voltage to said second plurality of signal lines while applying said first voltage to said first plurality of signal lines.

15. The apparatus of claim 11, wherein said at least one transistor comprises a PMOS transistor having a source contact, a drain contact, a gate contact and said body contact, wherein in said first power mode said first voltage is applied to said source contact while said second voltage is applied to said body contact, said second voltage being higher than said first voltage so as to cause reverse body bias of said at least one transistor in said first power mode.

16. The apparatus of claim 11, wherein said at least one transistor comprises an NMOS transistor having a source contact, a drain contact, a gate contact and said body contact, wherein in said first power mode said second voltage is applied to said source contact while said second voltage is applied to said body contact, said second voltage being lower than said first voltage so as to cause reverse body bias of said at least one transistor in said first power mode.

17. The apparatus of claim 12, wherein said second plurality of signal lines are substantially perpendicular to said fourth plurality of signal lines.

18. The apparatus of claim 11, wherein said second voltage causes a reverse body bias of said at least one transistor.

19. The apparatus of claim 11, further comprising an operating system device, coupled to said voltage regulating device, to control an operational power mode of said plurality of transistors.

20. The apparatus of claim 11, wherein the third voltage comprises a ground voltage.

21. A method of powering a chip in a first power mode and a second power mode, said method comprising:
applying a first voltage to at least one transistor provided within said chip;
powering said chip in said first power mode by applying a second voltage to a body contact of said at least one transistor while said first voltage is applied to said at least one transistor; and
powering said chip in said second power mode by applying a third voltage to said body contact of said at least one transistor while said first voltage is applied to said at least one transistor.

22. The method of claim 21, wherein in said first power mode said second voltage creates a reverse body bias of said at least one transistor.

23. The method of claim 21, wherein powering said chip in said first power mode includes applying a fourth voltage to another transistor of said chip and applying a fifth voltage to a body contact of said another transistor, and powering said chip in said second power mode includes applying a sixth voltage to said body contact of said another transistor while said fourth voltage is applied to said another transistor.

24. The method of claim 21, wherein said transistor comprises a PMOS transistor having a source contact, a drain contact, a gate contact and said body contact, wherein in said first power mode said first voltage is applied to said source contact while said second voltage is applied to said body contact, said second voltage being higher than said first voltage so as to cause reverse body bias of said at least one transistor in said first power mode.

25. The method of claim 21, wherein said transistor comprises an NMOS transistor having a source contact, a drain contact, a gate contact and said body contact, wherein in said first power mode said first voltage is applied to said source contact while said second voltage is applied to said body contact, said second voltage being lower than said first voltage so as to cause reverse body bias of said at least one transistor in said first power mode.

26. The method of claim 21, wherein the third voltage comprises a ground voltage.

27. A method of powering a chip, said method comprising:

applying power to said chip based on a normal power mode; and applying power to said chip based on a lower power mode.

28. The method of claim 27, wherein applying power to said chip based on said lower power mode comprises causing a reverse body bias on transistors of said chip.

29. The method of claim 28, wherein said transistors comprise a PMOS transistor having a source contact, a drain contact, a gate contact and a body contact, and wherein in said lower power mode applying power in said lower power mode comprises applying a first voltage to said source contact while applying a second voltage to said body contact, said second voltage being higher than said first voltage so as to cause reverse body bias of said PMOS transistor in said lower power mode.

30. The method of claim 28, wherein said transistors comprise an NMOS transistor having a source contact, a drain contact, a gate contact and a body contact, and wherein in said lower power mode applying power in said lower power mode comprises applying a first voltage to said source contact while applying a second voltage to said body contact, said second voltage being lower than said first voltage so as to cause reverse body bias of said NMOS transistor in said lower power mode.

* * * * *